(12) United States Patent
Lin et al.

(10) Patent No.: US 10,435,933 B2
(45) Date of Patent: Oct. 8, 2019

(54) PIVOTING MECHANISM AND ELECTRONIC DEVICE

(71) Applicants: Che-Hsien Lin, Taipei (TW); Che-Hsien Chu, Taipei (TW); Wei-Ning Chai, Taipei (TW); Chun-An Shen, Taipei (TW)

(72) Inventors: Che-Hsien Lin, Taipei (TW); Che-Hsien Chu, Taipei (TW); Wei-Ning Chai, Taipei (TW); Chun-An Shen, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/231,400

(22) Filed: Dec. 22, 2018

(65) Prior Publication Data

US 2019/0203512 A1 Jul. 4, 2019

Related U.S. Application Data

(60) Provisional application No. 62/610,942, filed on Dec. 28, 2017.

(51) Int. Cl.
*E05D 11/10* (2006.01)
*H05K 5/00* (2006.01)
(Continued)

(52) U.S. Cl.
CPC .............. *E05D 11/1028* (2013.01); *E05D 3/14* (2013.01); *E05D 7/00* (2013.01); *F16C 11/12* (2013.01);
(Continued)

(58) Field of Classification Search
CPC ......... E05D 11/1028; E05D 7/00; E05D 3/14; H05K 5/0226; H05K 5/0017; F16C 11/12;
(Continued)

(56) References Cited

U.S. PATENT DOCUMENTS

D839,714 S * 2/2019 Chai ............................ D8/323
2012/0090135 A1* 4/2012 Soh ..................... E05D 11/0081
16/250

(Continued)

FOREIGN PATENT DOCUMENTS

CN 203067521 7/2013
TW I502143 10/2015

*Primary Examiner* — Abhishek M Rathod
(74) *Attorney, Agent, or Firm* — JCIPRNET

(57) ABSTRACT

A pivoting mechanism includes a first bracket having a first sliding slot, a second bracket having a second sliding slot, a torsion structure located between the first bracket and the second bracket, a first and a second sliding members and a first and a second elastic arms. The first and the second brackets are respectively pivoted to a first and a second sides of the torsion structure. The first sliding member is pivotally connected to the first side and slidably disposed in the first sliding slot. The second sliding member is pivotally connected to the second side and is slidably disposed in the second sliding slot. The first elastic arm connects the first sliding member and leans against a first inclined sidewall of the first sliding slot. The second elastic arm connects the second sliding member and leans against a second inclined sidewall of the second sliding slot.

20 Claims, 8 Drawing Sheets

(51) Int. Cl.
*H05K 5/02* (2006.01)
*F16C 11/12* (2006.01)
*E05D 3/14* (2006.01)
*E05D 7/00* (2006.01)

(52) U.S. Cl.
CPC ......... *H05K 5/0017* (2013.01); *H05K 5/0226* (2013.01); *E05Y 2201/484* (2013.01); *E05Y 2900/606* (2013.01)

(58) Field of Classification Search
CPC ........ E05Y 2900/606; E05Y 2201/484; H04M 1/022; H04M 1/0237; G06F 1/16
See application file for complete search history.

(56) References Cited

U.S. PATENT DOCUMENTS

| | | | | |
|---|---|---|---|---|
| 2016/0319581 A1* | 11/2016 | Lin | ........................ | G06F 1/1681 |
| 2017/0138103 A1* | 5/2017 | Hong | ........................ | E05D 3/18 |
| 2018/0164856 A1* | 6/2018 | Lin | ........................ | E05D 3/04 |
| 2018/0239400 A1* | 8/2018 | Lin | ........................ | G06F 1/1681 |
| 2018/0341295 A1* | 11/2018 | Lan | ........................ | G06F 1/1681 |
| 2018/0364768 A1* | 12/2018 | Lin | ........................ | G06F 1/1681 |

* cited by examiner

PIVOTING MECHANISM AND ELECTRONIC DEVICE

CROSS-REFERENCE TO RELATED APPLICATION

This application claims the priority benefit of U.S. provisional application Ser. No. 62/610,942, filed on Dec. 28, 2017. The entirety of the above-mentioned patent application is hereby incorporated by reference herein and made a part of this specification.

BACKGROUND

Technical Field

The invention relates to a pivoting mechanism and an electronic device, and more particularly to a pivoting mechanism capable of increasing torsion and an electronic device applying the pivoting mechanism.

Description of Related Art

Generally, two display modules are pivotally connected through a pivoting mechanism most of the time in a foldable electronic device, so that a user may enable the two display modules of the foldable electronic device to be unfolded or folded relative to each other through the pivoting mechanism, so as to work on the electronic device or store the electronic device away. Nevertheless, when the foldable electronic device is unfolded, the pivoting mechanism is exposed between the two display modules, so a gap evidently exists between the two modules, and that the user may not enjoy consecutive frames when viewing on the electronic device, and visual quality is also affected. From another perspective, assembly tolerance and a gap between parts may lead to insufficient friction generated between structures, and the two display modules may slide (i.e., an idle operation) after being unfolded at an angle, so that the user may not be able to enjoy satisfying hand feeling as a result.

SUMMARY

The invention provides a pivoting mechanism capable of preventing an idle operation from being generated.

The invention further provides an electronic device including the pivoting mechanism and capable of preventing an idle operating from being generated and providing satisfying hand feeling to a user.

A pivoting mechanism in an embodiment of the invention includes a first bracket, a second bracket, a torsion structure, a first sliding member, a second sliding member, a first elastic arm, and a second elastic arm. The first bracket has a first sliding slot. The second bracket has a second sliding slot. The torsion structure is located between the first bracket and the second bracket and has a first side and a second side. The first bracket is pivoted to a first side of the torsion structure, and the second bracket is pivoted to a second side of the torsion structure. The first sliding member is pivotally connected to the first side of the torsion structure and is slidably disposed in the first sliding slot of the first bracket. The second sliding member is pivotally connected to the second side of the torsion structure and is slidably disposed in the second sliding slot of the second bracket. The first elastic arm connects the first sliding member and leans against a first inclined sidewall of the first sliding slot. The second elastic arm connects the second sliding member and leans against a second inclined sidewall of the second sliding slot. When the first bracket is rotated relative to the second bracket from a folded position to an unfolded position, the torsion structure is rotated to drive the first sliding member and the second sliding member to slide respectively in the first sliding slot and the second sliding slot, and the first inclined sidewall of the first sliding slot and the second inclined sidewall of the second sliding slot respectively compress the first elastic arm and the second elastic arm gradually.

In an embodiment of the invention, the torsion structure includes a first pivot arm and a second pivot arm pivotally connected to each other. The first pivot arm has the first side, and the second pivot arm has the second side.

In an embodiment of the invention, the pivoting mechanism further includes a shared shaft penetrating through a first pivot hole of the first pivot arm and a second pivot hole of the second pivot arm, so that the first pivot arm is pivotally connected to the second pivot arm.

In an embodiment of the invention, the first bracket further includes a first positioning hole, and the second bracket further includes a second positioning hole. The pivoting mechanism further includes a first fixed shaft and a second fixed shaft. The first fixed shaft penetrates through a first stress releasing hole of the first pivot arm and is located in the first stress releasing hole and the second positioning hole of the second bracket. The second fixed shaft penetrates through a second stress releasing hole of the second pivot arm and is located in the second stress releasing hole and the first positioning hole of the first bracket.

In an embodiment of the invention, the first sliding member has a first pair of shaft holes, and the second sliding member has a second pair of shaft holes. The pivoting mechanism further includes a first rotating shaft and a second rotating shaft. The first rotating shaft penetrates through the first pair of shaft holes of the first sliding member and the first side of the first pivot arm. The second rotating shaft penetrates through the second pair of shaft holes of the second sliding member and the second side of the second pivot arm.

In an embodiment of the invention, the first pivot arm is formed by a plurality of first sheet-like pivot arms, and the second pivot arm is formed by a plurality of second sheet-like pivot arms.

In an embodiment of the invention, the pivoting mechanism further includes a first fixed member and a second fixed member. The first fixed member is fixed in the first sliding slot of the first bracket and includes a first guiding portion. The first guiding portion is configured to guide the first sliding member to slide relative to the first sliding slot. The second fixed member is fixed in the second sliding slot of the second bracket and includes a second guiding portion. The second guiding portion is configured to guide the second sliding member to slide relative to the second sliding slot.

In an embodiment of the invention, the pivoting mechanism further includes at least one first locking member, at least one second locking member, at least one third locking member, and at least one fourth locking member. The at least one first locking member penetrates through at least one first assembly hole of the first bracket and at least one first fixed hole of the first fixed member, so that the first fixed member is fixed onto the first bracket. The at least one second locking member penetrates through at least one second assembly hole of the second bracket and at least one second fixed hole of the second fixed member so that the second fixed member is fixed onto the second bracket. The at least one third locking member penetrates through at least one third assembly hole of the first bracket and locked onto the first bracket, so as to limit a displacement of the first sliding member. The at least one fourth locking member penetrates through at least one fourth assembly hole of the second bracket to be locked onto the second bracket, so as to limit a displacement of the second sliding member.

In an embodiment of the invention, the first elastic arm is integrally connected to the first sliding member, and the second elastic arm is integrally connected to the second sliding member.

In an embodiment of the invention, the first elastic arm is connected to a first sliding member through engagement, and the second elastic arm is connected to a second sliding member through engagement.

An electronic device in an embodiment of the invention includes a first body, a second body, and at least one pivoting mechanism. The pivoting mechanisms is pivotally connected to the first body and the second body so that the first body can rotate relative to the second body. The pivoting mechanism includes a first bracket, a second bracket, a torsion structure, a first sliding member, a second sliding member, a first elastic arm, and a second elastic arm. The first bracket is fixed onto the first body and has a first sliding slot. The second bracket is fixed onto the second body and has a second sliding slot. The torsion structure is located between the first bracket and the second bracket and has a first side and a second side. The first bracket is pivoted to a first side of the torsion structure, and the second bracket is pivoted to a second side of the torsion structure. The first sliding member is pivotally connected to the first side of the torsion structure and is slidably disposed in the first sliding slot of the first bracket. The second sliding member is pivotally connected to the second side of the torsion structure and is slidably disposed in the second sliding slot of the second bracket. The first elastic arm connects the first sliding member and leans against a first inclined sidewall of the first sliding slot. The second elastic arm connects the second sliding member and leans against a second inclined sidewall of the second sliding slot. When the first body is rotated relative to the second body, while the first bracket is rotated relative to the second bracket from a folded position to an unfolded position, the torsion structure is rotated to drive the first sliding member and the second sliding member to slide respectively in the first sliding slot and the second sliding slot, and the first inclined sidewall of the first sliding slot and the second inclined sidewall of the second sliding slot respectively compress the first elastic arm and the second elastic arm gradually.

In an embodiment of the invention, the torsion structure includes a first pivot arm and a second pivot arm pivotally connected to each other. The first pivot arm has the first side, and the second pivot arm has the second side.

In an embodiment of the invention, the pivoting mechanism further includes a shared shaft penetrating through a first pivot hole of the first pivot arm and a second pivot hole of the second pivot arm, so that the first pivot arm is pivotally connected to the second pivot arm.

In an embodiment of the invention, the first bracket further includes a first positioning hole, and the second bracket further includes a second positioning hole. The pivoting mechanism further includes a first fixed shaft and a second fixed shaft. The first fixed shaft penetrates through a first stress releasing hole of the first pivot arm and is located in the first stress releasing hole and the second positioning hole of the second bracket. The second fixed shaft penetrates through a second stress releasing hole of the second pivot arm and is located in the second stress releasing hole and the first positioning hole of the first bracket.

In an embodiment of the invention, the first sliding member has a first pair of shaft holes, and the second sliding member has a second pair of shaft holes. The pivoting mechanism further includes a first rotating shaft and a second rotating shaft. The first rotating shaft penetrates through the first pair of shaft holes of the first sliding member and the first side of the first pivot arm. The second rotating shaft penetrates through the second pair of shaft holes of the second sliding member and the second side of the second pivot arm.

In an embodiment of the invention, the first pivot arm is formed by a plurality of first sheet-like pivot arms, and the second pivot arm is formed by a plurality of second sheet-like pivot arms.

In an embodiment of the invention, the pivoting mechanism further includes a first fixed member and a second fixed member. The first fixed member is fixed in the first sliding slot of the first bracket and includes a first guiding portion. The first guiding portion is configured to guide the first sliding member to slide relative to the first sliding slot. The second fixed member is fixed in the second sliding slot of the second bracket and includes a second guiding portion. The second guiding portion is configured to guide the second sliding member to slide relative to the second sliding slot.

In an embodiment of the invention, the pivoting mechanism further includes at least one first locking member, at least one second locking member, at least one third locking member, and at least one fourth locking member. The at least one first locking member penetrates through at least one first assembly hole of the first bracket and at least one first fixed hole of the first fixed member, so that the first fixed member is fixed onto the first bracket. The at least one second locking member penetrates through at least one second assembly hole of the second bracket and at least one second fixed hole of the second fixed member so that the second fixed member is fixed onto the second bracket. The at least one third locking member penetrates through at least one third assembly hole of the first bracket and locked onto the first bracket, so as to limit a displacement of the first sliding member. The at least one fourth locking member penetrates through at least one fourth assembly hole of the second bracket to be locked onto the second bracket, so as to limit a displacement of the second sliding member.

In an embodiment of the invention, the first elastic arm is integrally connected to the first sliding member, and the second elastic arm is integrally connected to the second sliding member.

In an embodiment of the invention, the first elastic arm is connected to a first sliding member through engagement, and the second elastic arm is connected to a second sliding member through engagement.

To sum up, in the design of the pivoting mechanism provided by the invention, when the first bracket is rotated relative to the second bracket from the folded position to the unfolded position, the torsion structure is rotated to drive the first sliding member and the second sliding member to slide respectively in the first sliding slot and the second sliding slot. Simultaneously, the first inclined sidewall of the first sliding slot and the second inclined sidewall of the second sliding slot respectively compress the first elastic arm and the second elastic arm gradually, so that the torsion of the pivoting structure is increased at a large angle. That is, torsion is controlled through compression provided by the inclined sidewalls to the elastic arms in the pivoting mechanism of the invention, so that sliding (i.e., an idle operation) is prevented from being generated after unfolding at an angle. Therefore, the electronic device applying the pivoting mechanism provided by the invention can provide satisfying hand feeling to the user.

To make the aforementioned more comprehensible, several embodiments accompanied with drawings are described in detail as follows.

DESCRIPTION OF THE EMBODIMENTS

Figure 1A:
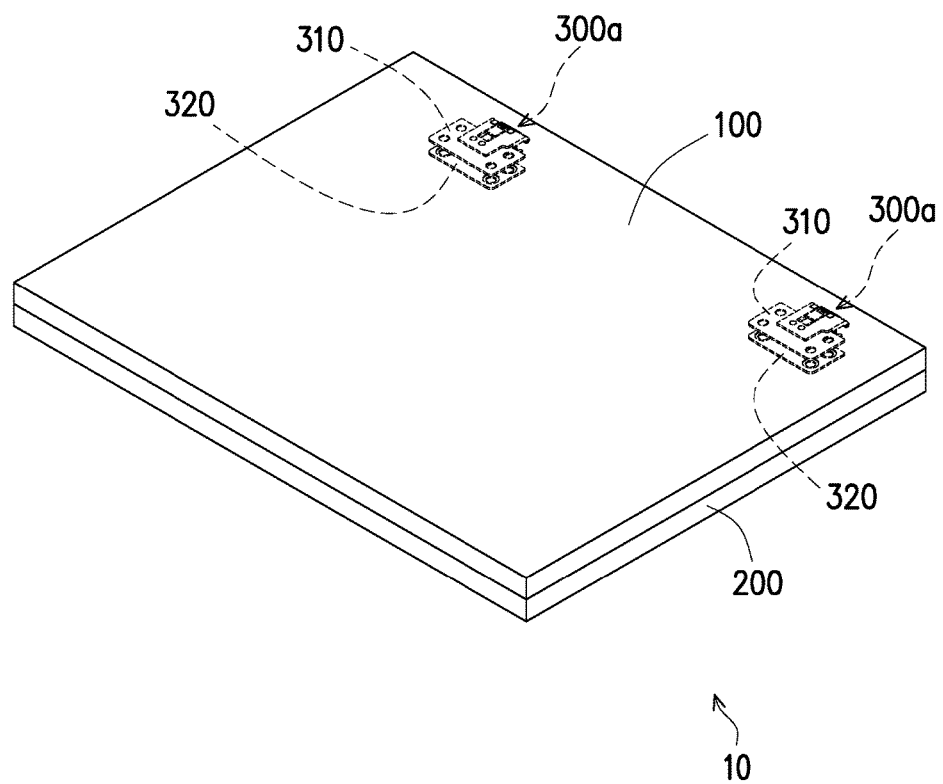
FIG. 1A is a schematic three-dimensional view illustrating an electronic device according to an embodiment of the invention.
Figure 1B:
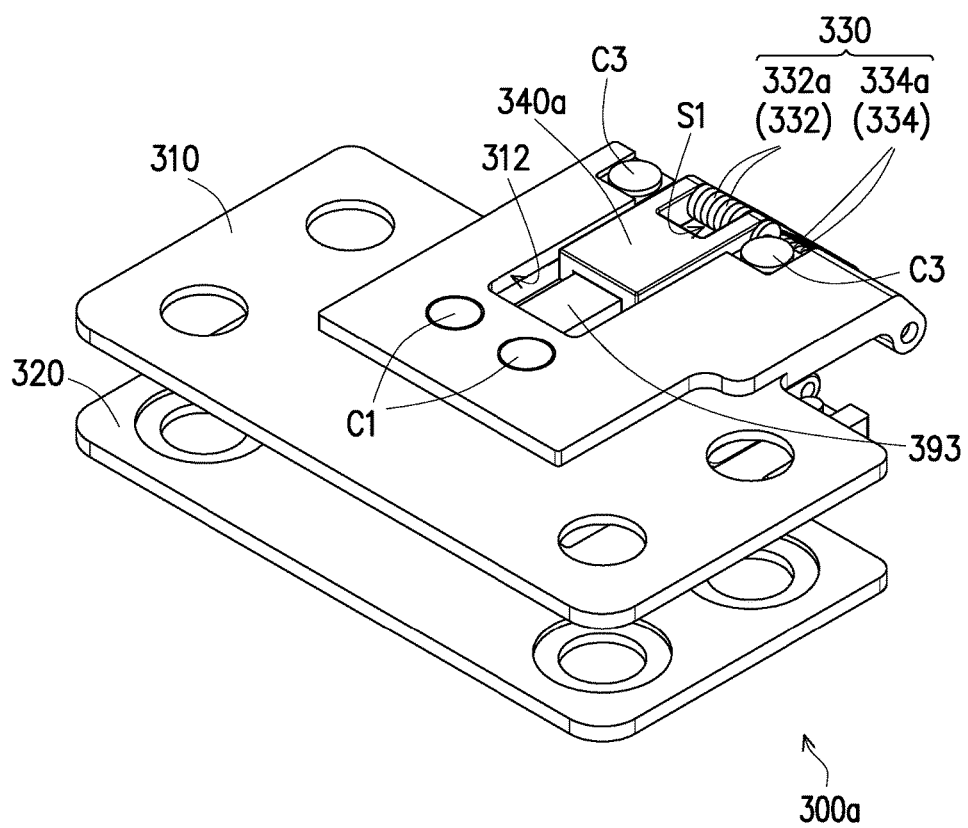
FIG. 1B is a schematic three-dimensional view illustrating a pivoting mechanism of the electronic device of FIG. 1A.
Figure 1C:
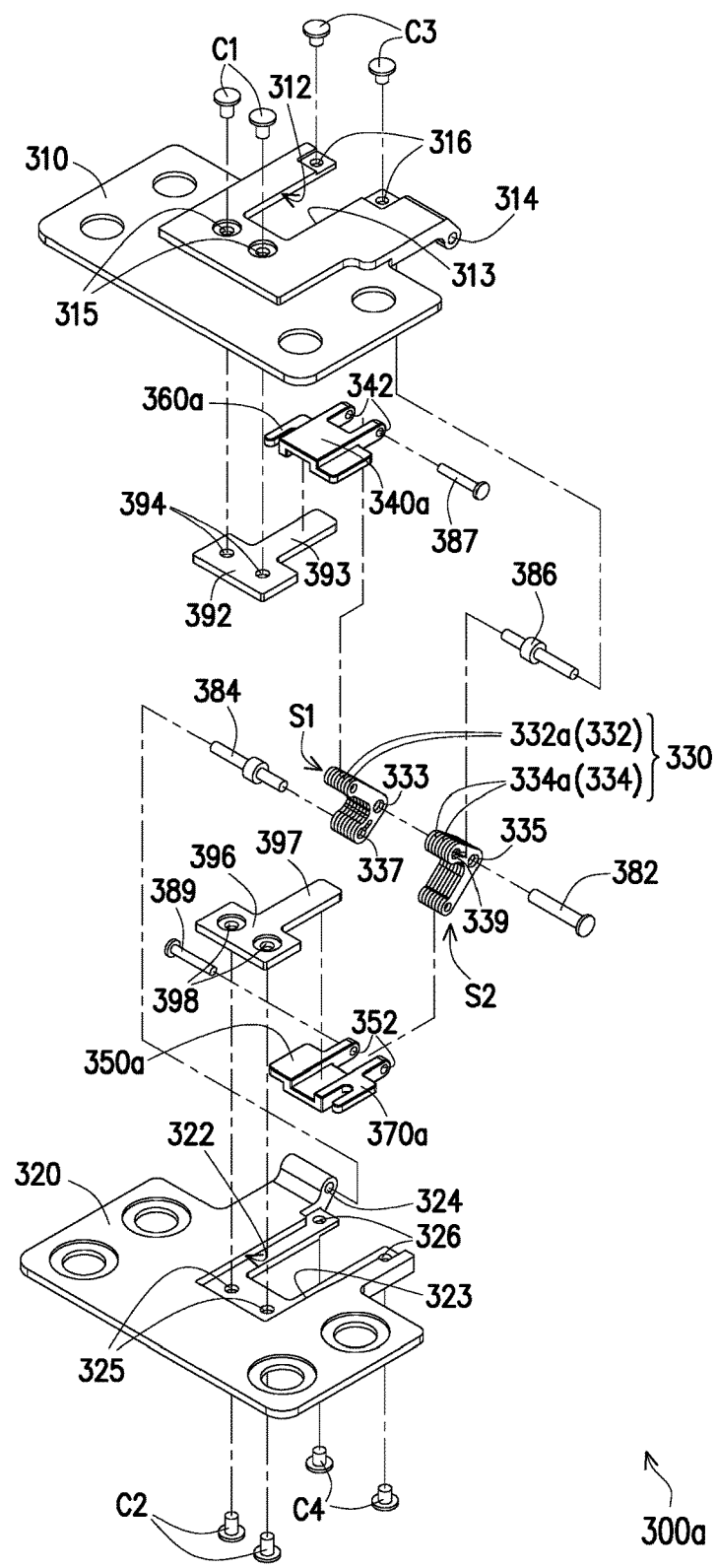
FIG. 1C is a schematic exploded view illustrating the pivoting mechanism of FIG. 1B.
Figure 1D:
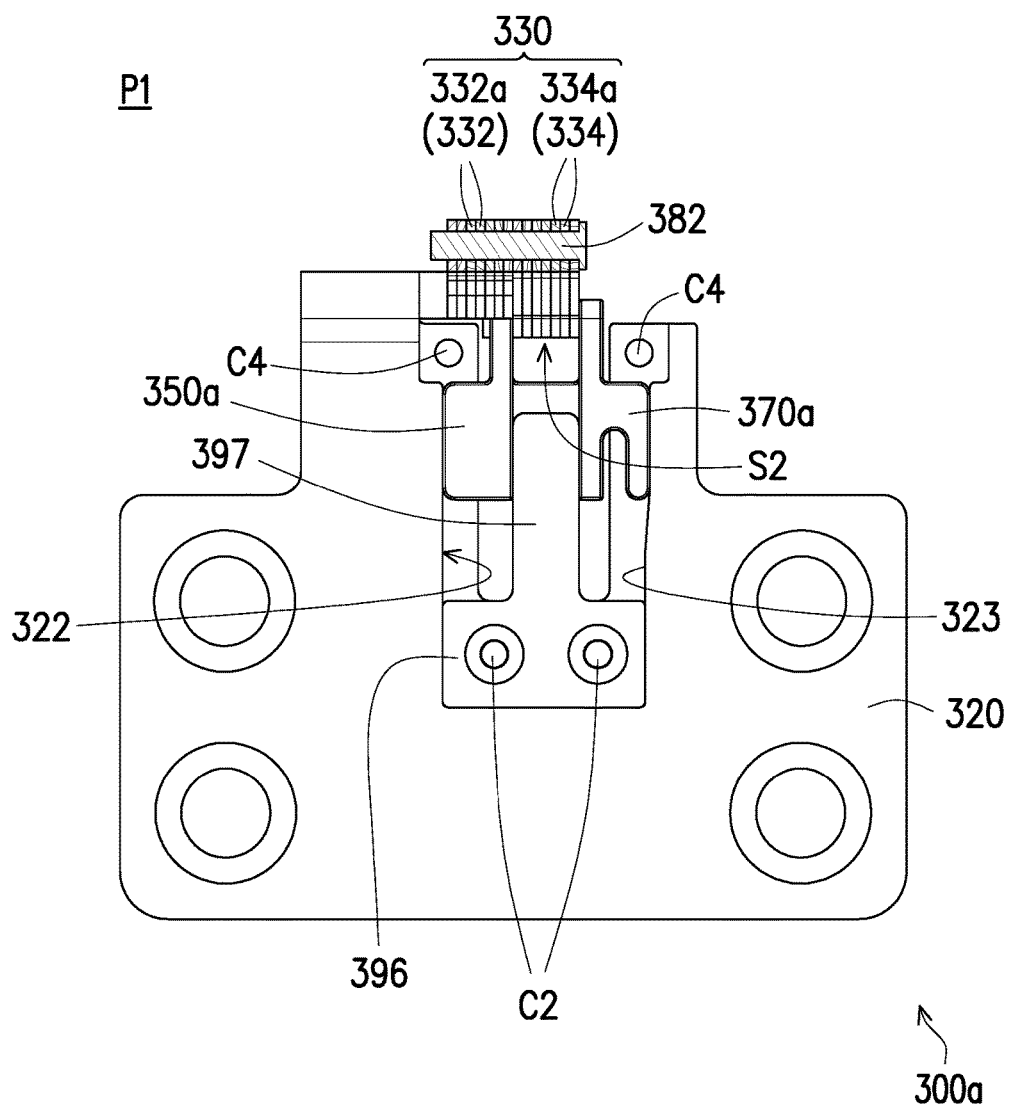
FIG. 1D is a schematic local top view illustrating a portion of the pivoting mechanism of FIG. 1B in a folded state.
Figure 1E:
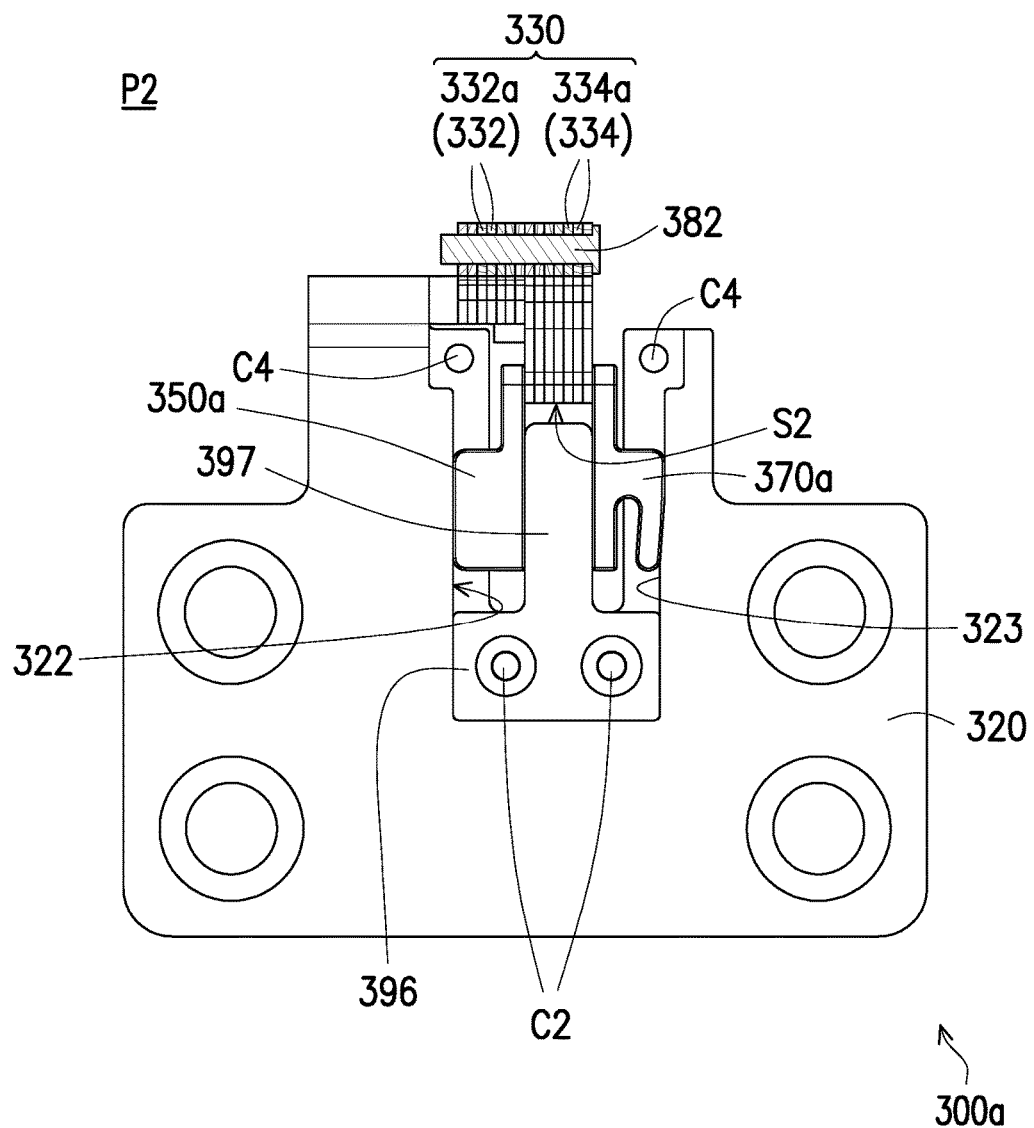
FIG. 1E is a schematic local top view illustrating a portion of the pivoting mechanism of FIG. 1B in an unfolded state.

FIG. 1A is a schematic three-dimensional view illustrating an electronic device according to an embodiment of the invention. FIG. 1B is a schematic three-dimensional view illustrating a pivoting mechanism of the electronic device of FIG. 1A. FIG. 1C is a schematic exploded view illustrating the pivoting mechanism of FIG. 1B. FIG. 1D is a schematic local top view illustrating a portion of the pivoting mechanism of FIG. 1B in a folded state. FIG. 1E is a schematic local top view illustrating a portion of the pivoting mechanism of FIG. 1B in an unfolded state.

With reference to FIG. 1A first, an electronic device 10 of this embodiment includes a first body 100, a second body 200, and at least one pivoting mechanism 300a (two are schematically illustrated). The pivoting mechanisms 300a are pivotally connected to the first body 100 and the second body 200 so that the first body 100 rotates relative to the second body 200. Herein, the electronic device 10 is, for example, a foldable electronic apparatus, and the first body 100 and the second body 200 may both be, for example, display screens, or alternatively, the first body 100 may be, for example, a display screen and the second body 200 may be, for example, a host module, and both fall in the scope for which the invention seeks to protect.

With reference to FIG. 1A, FIG. 1B, FIG. 1C, and FIG. 1D together, each of the pivoting mechanisms 300a of this embodiment includes a first bracket 310, a second bracket 320, a torsion structure 330, a first sliding member 340a, a second sliding member 350a, a first elastic arm 360a, and a second elastic arm 370a.

Specifically, the first bracket 310 is fixed onto the first body 100, and the first bracket 310 has a first sliding slot 312 and a first positioning hole 314. The second bracket 320 is fixed onto the second body 200, and the second bracket 320 has a second sliding slot 322 and a second positioning hole 324. The first bracket 310 and the second bracket 320 are disposed on the first body 100 and the second body 200 in a parallel manner. Preferably, a structure of the first bracket 310 and a structure of the second bracket 320 are completely identical. The torsion structure 330 is located between the first bracket 310 and the second bracket 320 and has a first side S1 and a second side S2. The first bracket 310 is pivoted to the first side S1 of the torsion structure 330, and the second bracket 320 is pivoted to the second side S2 of the torsion structure 330.

More specifically, the torsion structure 330 of this embodiment includes a pivotally connected first pivot arm 332 and a second pivot arm 334, and the first pivot arm 332 has the first side S1, and the second pivot arm 334 has the second side S2. As shown in FIG. 1C, the first pivot arm 332 is formed by a plurality of first sheet-like pivot arms 332a, while the first sheet-like pivot arms 332a share a same structure and overlap each other, and a number of the first sheet-like pivot arms 332a is greater than 2. Similarly, the second pivot arm 334 is formed by a plurality of second sheet-like pivot arms 334a, while the second sheet-like pivot arms 334a share a same structure and overlap each other, and a number of the second sheet-like pivot arms 334a is greater than 2. Since the torsion structure 330 of this embodiment is formed by lapping the first sheet-like pivot arms 332a and the second sheet-like pivot arms 334a, the torsion structure 330 features the advantage of miniaturization.

With reference to FIG. 1A, FIG. 1B, FIG. 1C, and FIG. 1D together, the first sliding member 340a is pivotally connected to the first side S1 of the torsion structure 330 and is slidably disposed in the first sliding slot 312 of the first bracket 310. The second sliding member 350a is pivotally connected to the second side S2 of the torsion structure 330 and is slidably disposed in the second sliding slot 322 of the second bracket 320. Herein, the first sliding member 340a and the second sliding member 350a are located between the first bracket 310 and the second bracket 320, and the first sliding member 340a has a first pair of shaft holes 342, and the second sliding member 350a has a second pair of shaft holes 352. The pivoting mechanism 300a of this embodiment may include a first rotating shaft 387 and a second rotating shaft 389. The first rotating shaft 387 penetrates through the first pair of shaft holes 342 of the first sliding member 340a and the first side S1 of the first pivot arm 332, and thereby, the first sliding member 340a is linked up to slide in the first sliding slot 312 when the first rotating shaft 387 rotates. The second rotating shaft 389 penetrates through the second pair of shaft holes 352 of the second sliding member 350a and the second side S2 of the second pivot arm 334, and thereby, the second sliding member 350a is linked up to slide in the second sliding slot 322 when the second rotating shaft 389 rotates.

The first elastic arm 360a connects the first sliding member 340a and leans against a first inclined sidewall 313 of the first sliding slot 312. The second elastic arm 370a connects the second sliding member 350a and leans against a second inclined sidewall 323 of the second sliding slot 322. Particularly, the first elastic arm 360a of this embodiment is integrally connected to the first sliding member 340a, and the second elastic arm 370a is integrally connected to the second sliding member 350a. The first elastic arm 360a and the second elastic arm 370a are both elastic and thus may generate elastic deformation after being applied by a force.

Further, the pivoting mechanism 300a of this embodiment further includes a shared shaft 382, and the shared shaft 380 penetrates through a first pivot hole 333 of the first pivot arm 332 and a second pivot hole 335 of the second pivot arm 334, so that the first pivot arm 332 is pivotally connected to the second pivot arm 334. The pivoting mechanism 300a may further include a first fixed shaft 384 and a second fixed shaft 386. The first fixed shaft 384 penetrates through a first stress releasing hole 337 of the first pivot arm 332 and is located in the first stress releasing hole 337 and the second positioning hole 324 of the second bracket 320. The second fixed shaft 386 penetrates through a second stress releasing hole 339 of the second pivot arm 334 and is located in the second stress releasing hole 339 and the first positioning hole 314 of the first bracket 310.

Since the first fixed shaft 384 and the second fixed shaft 386 respectively penetrate through the first stress releasing hole 337 and the second stress releasing hole 339 in this embodiment, when the first bracket 310 is rotated relative to the second bracket 320, the first stress releasing hole 337 and the second stress releasing hole 339 may respectively release stress applied on the first pivot arm 332 and the second pivot arm 334 by the first fixed shaft 384 and the second fixed shaft 386, so that a level of fatigue of the torsion structure 330 is lowered and durability of the pivoting mechanism 300a is further increased.

In addition, the pivoting mechanism 300a of this embodiment further includes a first fixed member 392 and a second fixed member 396. The first fixed member 392 is fixed in the first sliding slot 312 of the first bracket 310 and includes a first guiding portion 393, and the first guiding portion 393 is configured to guide the first sliding member 340a to slide relative to the first sliding slot 312. The second fixed member 396 is fixed in the second sliding slot 322 of the second bracket 320 and includes a second guiding portion 397, and the second guiding portion 397 is configured to guide the second sliding member 350a to slide relative to the second sliding slot 322.

In addition, the pivoting mechanism 300a of this embodiment further includes at least one first locking member C1 (two are schematically illustrated), at least one second locking member C2 (two are schematically illustrated), at least one third locking member C3 (two are schematically illustrated), and at least one fourth locking member C4 (two are schematically illustrated). The first locking member Cl penetrates through at least one first assembly hole 315 (two are schematically illustrated) of the first bracket 310 and at least one first fixed hole 394 (two are schematically illustrated) of the first fixed member 392, so that the first fixed member 392 is fixed onto the first bracket 310. The second locking member C2 penetrates through at least one second assembly hole 325 (two are schematically illustrated) of the second bracket 320 and at least one second fixed hole 398 (two are schematically illustrated) of the second fixed member 396, so that the second fixed member 396 is fixed onto the second bracket 320. The third locking member C3 penetrates through at least one third assembly hole 316 (two are schematically illustrated) of the first bracket 310 and is locked onto the first bracket 310, so as to limit a displacement of the first sliding member 340a. The fourth locking member C4 penetrates through at least one fourth assembly hole 326 (two are schematically illustrated) of the second bracket 320 and is locked onto the second bracket 320, so as to limit a displacement of the second sliding member 350a.

With reference to FIG. 1A, FIG. 1C, FIG. 1D, and FIG. 1E together, when the first body 100 is rotated relative to the second body 200, while the first bracket 310 is rotated relative to the second bracket 320 from a folded position P1 to an unfolded position P2, the torsion structure 330 is rotated to drive the first sliding member 340a and the second sliding member 350a to slide respectively in the first sliding slot 312 and the second sliding slot 322. At this time, the first inclined sidewall 313 of the first sliding slot 312 and the second inclined sidewall 323 of the second sliding slot 322 respectively compress the first elastic arm 360a and the second elastic arm 370a gradually, so that interference respectively from the first sliding slot 312 and the second sliding slot 322 in the first elastic arm 360a and the second elastic arm 370a rises (i.e., torsion gradually increases), so that torsion of the torsion structure 330 increases at a large angle (e.g., 180 degrees), so an increase in torsion and favorable hand feeling are provided.

From another perspective, assembly tolerance and a gap between parts may be eliminated through the design of the pivoting mechanism 300a of this embodiment, sufficient friction may thus be generated between structures, and that the first body 100 and the second body 200 are prevented from sliding after being unfolded at an angle, an idle operation is also prevented from being generated, and favorable hand feeling is thereby provided to the user. Further, since the first elastic arm 360a and the second elastic arm 370a are elastic, interference respectively from the first inclined sidewall 313 and the second inclined sidewall 323 in the first elastic arm 360a and the second elastic arm 370a may be converted into elastic deformation. Therefore, the interference and the elastic deformation may be controlled through controlling inclination of the first inclined sidewall 313 and the second inclined sidewall 323, and torsion and hand feeling are thereby controlled. In addition, when the first body 100 is in the unfolded state relative to the second body 200, the pivoting mechanism 300a may be hidden in the first body 100 and the second body 200, so a gap between the first body 100 and the second body 200 is reduced, enhanced visual quality is provided to the user, and the demand for a narrow border of the electronic device 10 is further satisfied.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 2A:
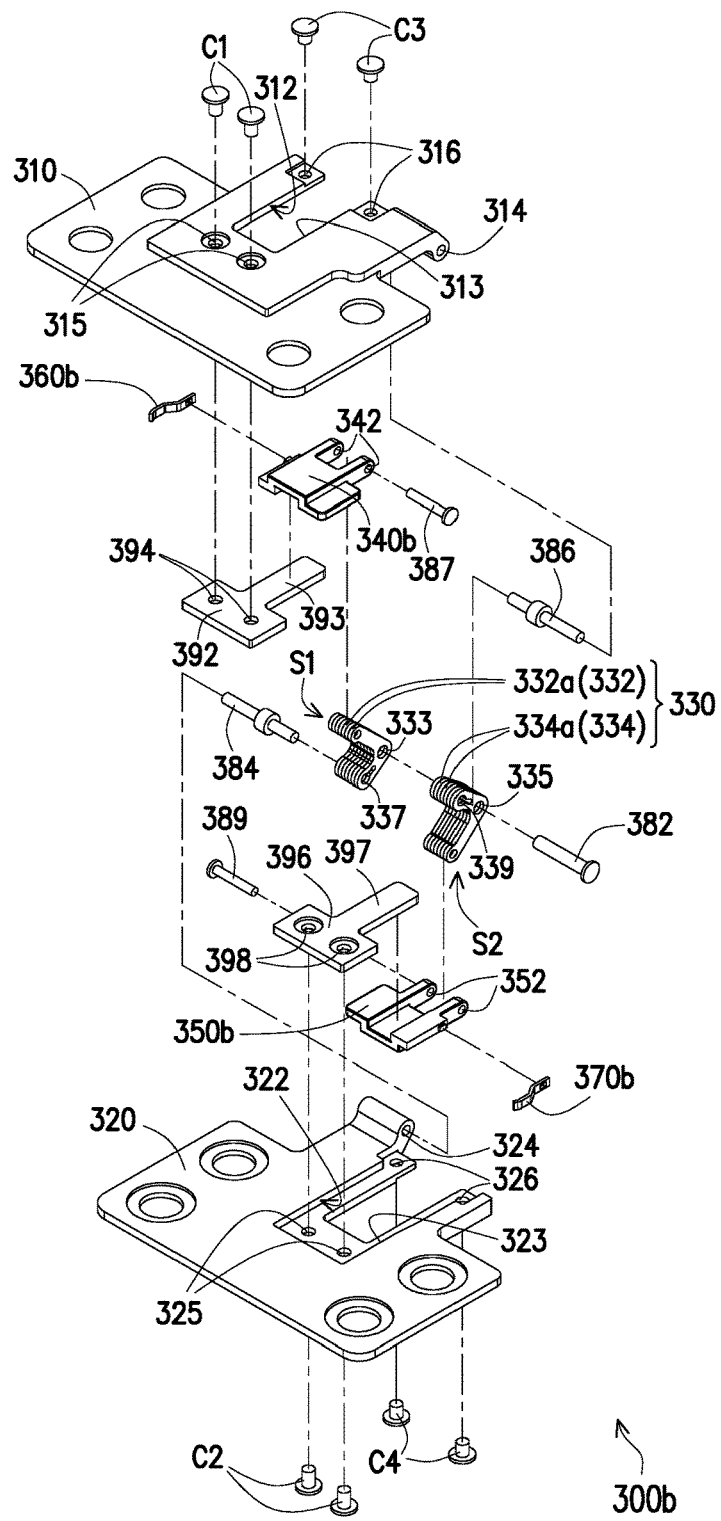
FIG. 2A is a schematic exploded view illustrating a pivoting mechanism according to another embodiment of the invention.
Figure 2B:
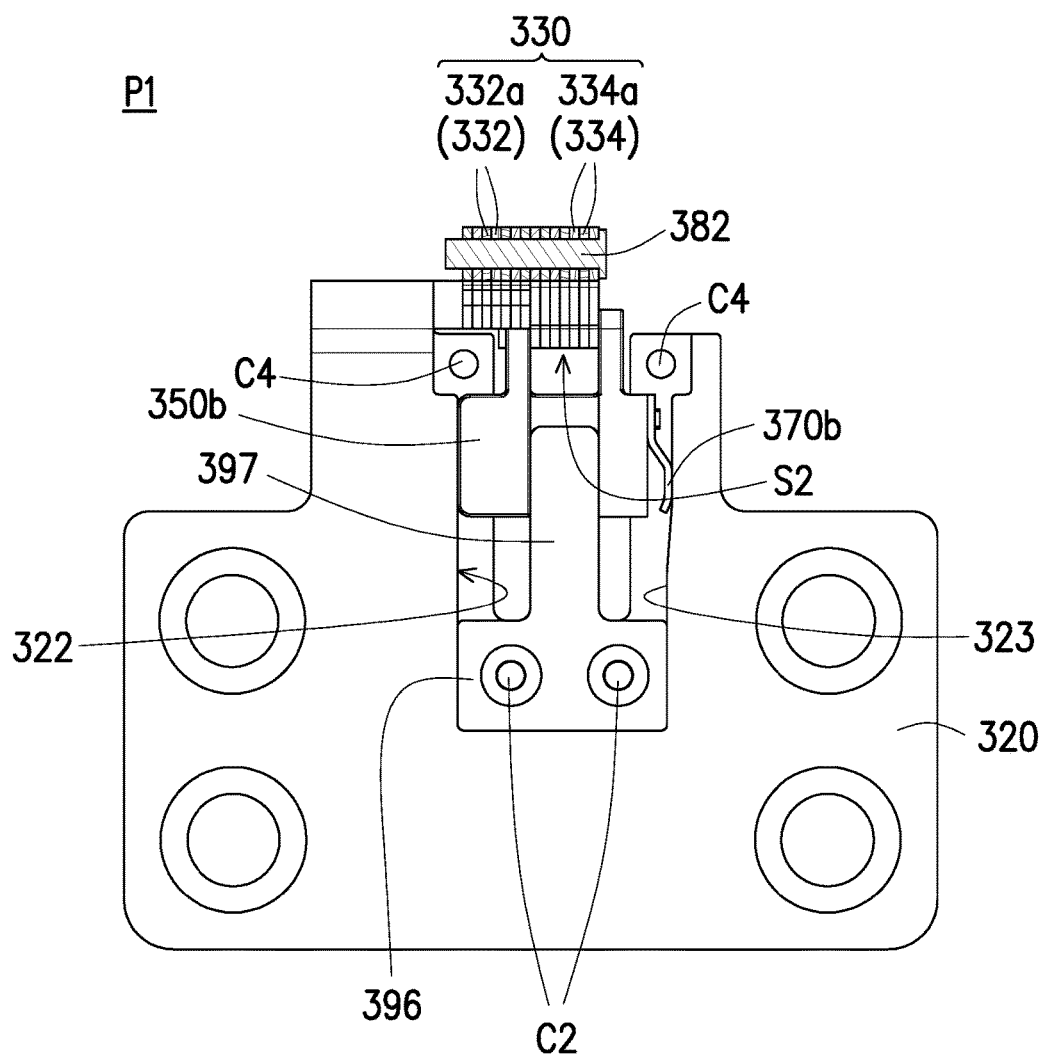
FIG. 2B is a schematic local top view illustrating a portion of the pivoting mechanism of FIG. 2A in the folded state.
Figure 2C:
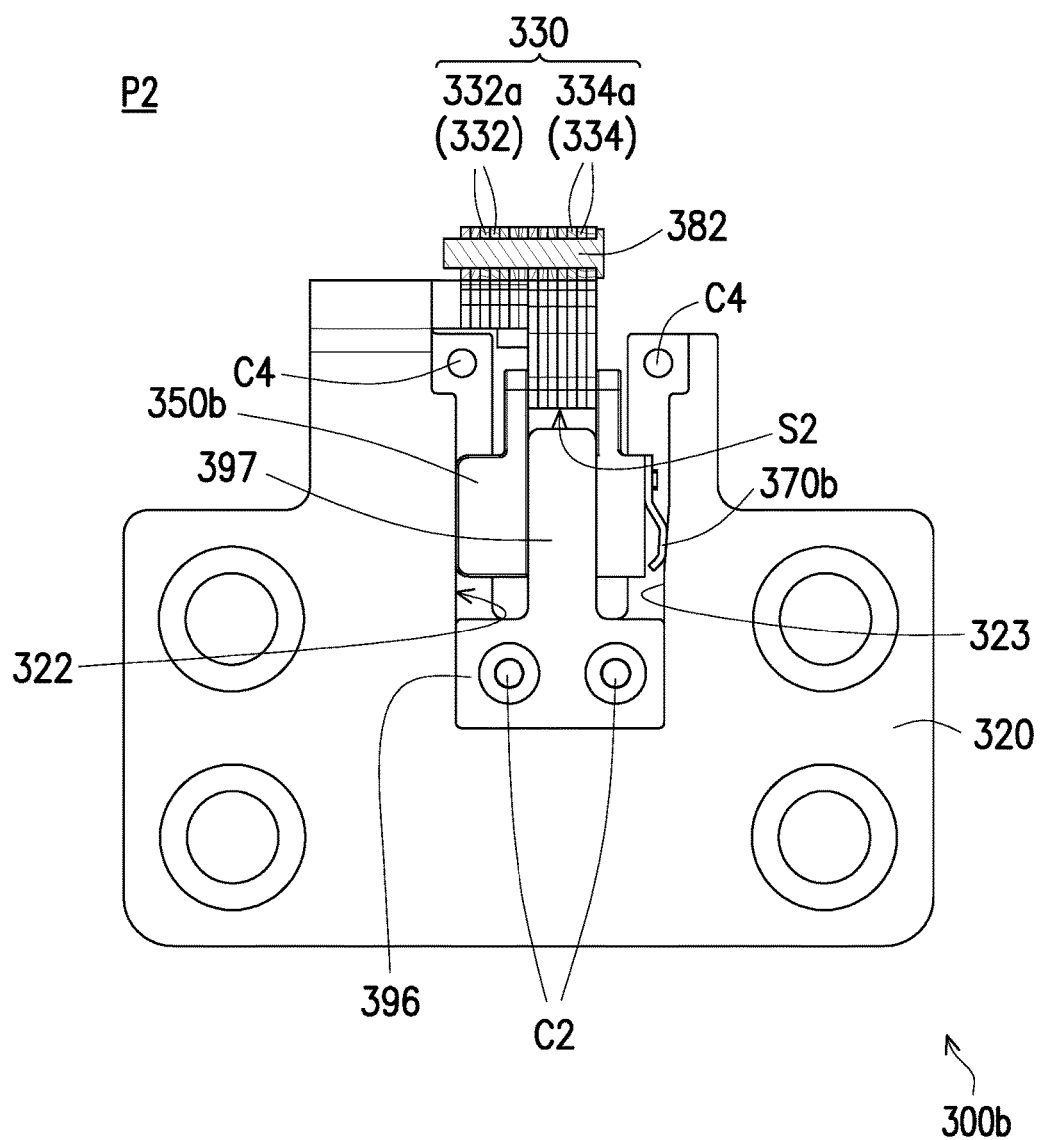
FIG. 2C is a schematic local top view illustrating a portion of the pivoting mechanism of FIG. 2A in the unfolded state.

FIG. 2A is a schematic exploded view illustrating a pivoting mechanism according to another embodiment of the invention. FIG. 2B is a schematic local top view illustrating a portion of the pivoting mechanism of FIG. 2A in the folded state. FIG. 2C is a schematic local top view illustrating a portion of the pivoting mechanism of FIG. 2A in the unfolded state. With reference to FIG. 1C and FIG. 2A together first, a pivoting mechanism 300b of this embodiment is similar to the pivoting mechanism 300a of FIG. 1C, but a difference therebetween includes that: a first elastic arm 360b of the pivoting mechanism 300b of this embodiment is connected to a first sliding member 340b through engagement, and a second elastic arm 370b is connected to a second sliding member 350b through engagement. That is, the first elastic arm 360b, the first sliding member 340b, the second elastic arm 370b, and the second sliding member 350b individually are independent members and are connected through assembly.

With reference to FIG. 2A, FIG. 2B, and FIG. 2C together, when the first bracket 310 is rotated relative to the second bracket 320 from the folded position P1 to the unfolded position P2, the torsion structure 330 is rotated to drive the first sliding member 340b and the second sliding member 350b to slide respectively in the first sliding slot 312 and the second sliding slot 322. At this time, the first inclined sidewall 313 of the first sliding slot 312 and the second inclined sidewall 323 of the second sliding slot 322 respectively compress the first elastic arm 360b and the second elastic arm 370b gradually, so that interference respectively from the first sliding slot 312 and the second sliding slot 322 in the first elastic arm 360b and the second elastic arm 370b rises (i.e., torsion gradually increases), so that torsion of the torsion structure 330 increases at a large angle (e.g., 180 degrees), so an increase in torsion is provided. From another perspective, assembly tolerance and a gap between parts may be eliminated through the design of the pivoting mechanism 300b of this embodiment, sufficient friction may thus be generated between structures, and that the first bracket 310 and the second bracket 320 are prevented from sliding after being unfolded at an angle, and an idle operation is also prevented from being generated.

In view of the foregoing, in the design of the pivoting mechanism provided by the invention, when the first bracket is rotated relative to the second bracket from the folded position to the unfolded position, the torsion structure is rotated to drive the first sliding member and the second sliding member to slide respectively in the first sliding slot and the second sliding slot. Simultaneously, the first inclined sidewall of the first sliding slot and the second inclined sidewall of the second sliding slot respectively compress the first elastic arm and the second elastic arm gradually, so that the torsion of the pivoting structure is increased at a large angle. That is, torsion is controlled through compression provided by the inclined sidewalls to the elastic arms in the pivoting mechanism of the invention, so that sliding (i.e., an idle operation) is prevented from being generated after unfolding at an angle. Therefore, the electronic device applying the pivoting mechanism provided by the invention can provide satisfying hand feeling to the user.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A pivoting mechanism, comprising:
   a first bracket, having a first sliding slot;
   a second bracket, having a second sliding slot;
   a torsion structure, located between the first bracket and the second bracket and having a first side and a second side, wherein the first bracket is pivoted to the first side of the torsion structure, and the second bracket is pivoted to the second side of the torsion structure;
   a first sliding member, pivotally connected to the first side of the torsion structure and slidably disposed in the first sliding slot of the first bracket;
   a second sliding member, pivotally connected to the second side of the torsion structure and slidably disposed in the second sliding slot of the second bracket;
   a first elastic arm, connecting the first sliding member and leaning against a first inclined sidewall of the first sliding slot; and
   a second elastic arm, connecting the second sliding member and leaning against a second inclined sidewall of the second sliding slot, wherein when the first bracket is rotated relative to the second bracket from a folded position to an unfolded position, the torsion structure is rotated to drive the first sliding member and the second sliding member to slide respectively in the first sliding slot and the second sliding slot, and the first inclined sidewall of the first sliding slot and the second inclined sidewall of the second sliding slot respectively compress the first elastic arm and the second elastic arm gradually.

2. The pivoting mechanism as claimed in claim 1, wherein the torsion structure comprises a first pivot arm and a second pivot arm pivotally connected to each other, the first pivot arm has the first side, and the second pivot arm has the second side.

3. The pivoting mechanism as claimed in claim 2, further comprising:
   a shared shaft, penetrating through a first pivot hole of the first pivot arm and a second pivot hole of the second pivot arm so that the first pivot arm is pivotally connected to the second pivot arm.

4. The pivoting mechanism as claimed in claim 2, wherein the first bracket further comprises a first positioning hole, the second bracket further comprises a second positioning hole, and the pivoting mechanism further comprises:
   a first fixed shaft, penetrating through a first stress releasing hole of the first pivot arm and located in the first stress releasing hole and the second positioning hole of the second bracket; and
   a second fixed shaft, penetrating through a second stress releasing hole of the second pivot arm and located in the second stress releasing hole and the first positioning hole of the first bracket.

5. The pivoting mechanism as claimed in claim 2, wherein the first sliding member has a first pair of shaft holes, the second sliding member has a second pair of shaft holes, and the pivoting mechanism further comprises:
   a first rotating shaft, penetrating through the first pair of shaft holes of the first sliding member and the first side of the first pivot arm; and
   a second rotating shaft, penetrating through the second pair of shaft holes of the second sliding member and the second side of the second pivot arm.

6. The pivoting mechanism as claimed in claim 2, wherein the first pivot arm is formed by a plurality of first sheet-like pivot arms, and the second pivot arm is formed by a plurality of second sheet-like pivot arms.

7. The pivoting mechanism as claimed in claim 1, further comprising:
   a first fixed member, fixed in the first sliding slot of the first bracket and comprising a first guiding portion, wherein the first guiding portion is configured to guide the first sliding member to slide relative to the first sliding slot; and
   a second fixed member, fixed in the second sliding slot of the second bracket and comprising a second guiding portion, wherein the second guiding portion is configured to guide the second sliding member to slide relative to the second sliding slot.

8. The pivoting mechanism as claimed in claim 7, further comprising:
   at least one first locking member, penetrating through at least one first assembly hole of the first bracket and at least one first fixed hole of the first fixed member so that the first fixed member is fixed onto the first bracket;
   at least one second locking member, penetrating through at least one second assembly hole of the second bracket and at least one second fixed hole of the second fixed member so that the second fixed member is fixed onto the second bracket;
   at least one third locking member, penetrating through at least one third assembly hole of the first bracket and locked onto the first bracket so as to limit a displacement of the first sliding member; and at least one fourth locking member, penetrating through at least one fourth assembly hole of the second bracket to be locked onto the second bracket so as to limit a displacement of the second sliding member.

9. The pivoting mechanism as claimed in claim 1, wherein the first elastic arm is integrally connected to the first sliding member, and the second elastic arm is integrally connected to the second sliding member.

10. The pivoting mechanism as claimed in claim 1, wherein the first elastic arm is connected to the first sliding member by means of engagement, and the second elastic arm is connected to the second sliding member by means of engagement.

11. An electronic device, comprising:
a first body;
a second body; and
at least one pivoting mechanism, pivotally connected to the first body and the second body so that the first body rotates relative to the second body, the pivoting mechanism comprising:
 a first bracket, fixed onto the first body, having a first sliding slot;
 a second bracket, fixed onto the second body, having a second sliding slot;
 a torsion structure, located between the first bracket and the second bracket and having a first side and a second side, wherein the first bracket is pivoted to the first side of the torsion structure, and the second bracket is pivoted to the second side of the torsion structure;
 a first sliding member, pivotally connected to the first side of the torsion structure and slidably disposed in the first sliding slot of the first bracket;
 a second sliding member, pivotally connected to the second side of the torsion structure and slidably disposed in the second sliding slot of the second bracket;
 a first elastic arm, connecting the first sliding member and leaning against a first inclined sidewall of the first sliding slot; and
 a second elastic arm, connecting the second sliding member and leaning against a second inclined sidewall of the second sliding slot, wherein when the first body is rotated relative to the second body while the first bracket is rotated relative to the second bracket from a folded position to an unfolded position, the torsion structure is rotated to drive the first sliding member and the second sliding member to slide respectively in the first sliding slot and the second sliding slot, and the first inclined sidewall of the first sliding slot and the second inclined sidewall of the second sliding slot respectively compress the first elastic arm and the second elastic arm gradually.

12. The electronic device as claimed in claim 11, wherein the torsion structure comprises a first pivot arm and a second pivot arm pivotally connected to each other, the first pivot arm has the first side, and the second pivot arm has the second side.

13. The electronic device as claimed in claim 12, further comprising:
a shared shaft, penetrating through a first pivot hole of the first pivot arm and a second pivot hole of the second pivot arm so that the first pivot arm is pivotally connected to the second pivot arm.

14. The electronic device as claimed in claim 12, wherein the first bracket further comprises a first positioning hole, the second bracket further comprises a second positioning hole, and the pivoting mechanism further comprises:
a first fixed shaft, penetrating through a first stress releasing hole of the first pivot arm and located in the first stress releasing hole and the second positioning hole of the second bracket; and
a second fixed shaft, penetrating through a second stress releasing hole of the second pivot arm and located in the second stress releasing hole and the first positioning hole of the first bracket.

15. The electronic device as claimed in claim 12, wherein the first sliding member has a first pair of shaft holes, the second sliding member has a second pair of shaft holes, and the pivoting mechanism further comprises:
a first rotating shaft, penetrating through the first pair of shaft holes of the first sliding member and the first side of the first pivot arm; and
a second rotating shaft, penetrating through the second pair of shaft holes of the second sliding member and the second side of the second pivot arm.

16. The electronic device as claimed in claim 12, wherein the first pivot arm is formed by a plurality of first sheet-like pivot arms, and the second pivot arm is formed by a plurality of second sheet-like pivot arms.

17. The electronic device as claimed in claim 11, further comprising:
a first fixed member, fixed in the first sliding slot of the first bracket and comprising a first guiding portion, wherein the first guiding portion is configured to guide the first sliding member to slide relative to the first sliding slot; and
a second fixed member, fixed in the second sliding slot of the second bracket and comprising a second guiding portion, wherein the second guiding portion is configured to guide the second sliding member to slide relative to the second sliding slot.

18. The electronic device as claimed in claim 17, further comprising:
at least one first locking member, penetrating through at least one first assembly hole of the first bracket and at least one first fixed hole of the first fixed member so that the first fixed member is fixed onto the first bracket;
at least one second locking member, penetrating through at least one second assembly hole of the second bracket and at least one second fixed hole of the second fixed member so that the second fixed member is fixed onto the second bracket;
at least one third locking member, penetrating through at least one third assembly hole of the first bracket and locked onto the first bracket so as to limit a displacement of the first sliding member; and
at least one fourth locking member, penetrating through at least one fourth assembly hole of the second bracket to be locked onto the second bracket so as to limit a displacement of the second sliding member.

19. The electronic device as claimed in claim 11, wherein the first elastic arm is integrally connected to the first sliding member, and the second elastic arm is integrally connected to the second sliding member.

20. The electronic device as claimed in claim 11, wherein the first elastic arm is connected to the first sliding member by means of engagement, and the second elastic arm is connected to the second sliding member by means of engagement.

* * * * *